United States Patent
Kwon

(10) Patent No.: US 6,210,990 B1
(45) Date of Patent: Apr. 3, 2001

(54) METHOD FOR FABRICATING SOLID STATE IMAGE SENSOR

(75) Inventor: Kyoung Kuk Kwon, Seoul (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/350,086

(22) Filed: Jul. 9, 1999

(30) Foreign Application Priority Data

Jul. 11, 1998 (KR) .................................. 98/28020
Mar. 18, 1999 (KR) .................................. 99/9230

(51) Int. Cl.$^7$ .................................................. H01L 21/00
(52) U.S. Cl. ...................... 438/60; 438/60; 438/75; 438/76; 438/144; 438/146; 257/215; 257/225; 257/229
(58) Field of Search .......................... 438/60, 75, 144, 438/146, 197, 577, 951; 257/215, 225, 229, 290

(56) References Cited

U.S. PATENT DOCUMENTS

| | | | |
|---|---|---|---|
| 5,024,963 | 6/1991 | Park et al. | 437/41 |
| 5,441,910 * | 8/1995 | Nakashiba | 438/75 |
| 5,578,511 * | 11/1996 | Son | 438/144 |
| 5,591,997 * | 1/1997 | Guidash et al. | 257/290 |
| 5,981,309 * | 11/1999 | Kim et al. | 438/60 |

* cited by examiner

*Primary Examiner*—Tuan H. Nguyen
*Assistant Examiner*—Asok Unman Sarkar
(74) *Attorney, Agent, or Firm*—Morgan, Lewis & Bockius LLP

(57) ABSTRACT

Method for fabricating a solid state image sensor, which can improve a charge transfer efficiency of an end terminal, including the steps of (1) providing a first conduction type substrate having a second conduction type well and a BCCD formed therein for an end terminal, (2) continuously increasing impurity concentrations in a region of the substrate in which a floating diffusion region is to be formed and in a portion of an area of other substrate in which the regions are are to be formed for improving a horizontal charge transfer efficiency, and (3) forming transfer gates, an output gate, and reset gate on the substrate, and the floating diffusion region and a reset drain region in the BCCD, respectively.

12 Claims, 10 Drawing Sheets

METHOD FOR FABRICATING SOLID STATE IMAGE SENSOR

BACKGROUND OF THE INVENTION

1. Field of the Invention

The present invention relates to a method for fabricating a solid state image sensor, and more particularly, to a method for fabricating a solid state image sensor, which can improve a charge transfer efficiency of an end terminal.

2. Background of the Related Art

Referring to FIG. 1, a related art solid state image sensor is provided with a plurality of photodiodes (PD) 1 each for converting a light signal into an electrical video charge signal, vertical charge coupled devices (VCCD) 2 each for transporting a video charge converted by the photodiode 1 in a vertical direction, a horizontal charge coupled device (HCCD) 3 for transporting the video charge transported in the vertical direction by the VCCD's 2 in a horizontal direction, an end terminal inclusive of a sensing amplifier 4 for sensing the video signal charge transported in the horizontal direction by the HCCD 3.

A related art method for fabricating an end terminal of a solid state image sensor will be explained with reference to the attached drawings. FIG. 2 illustrates a layout of a related art end terminal of a solid state image sensor. FIG. 3 illustrates a section across line I—I in FIG. 2, and FIGS. 4a and 4b illustrate plan views showing the steps of a related art method for fabricating an end terminal of a solid state image sensor. FIG. 5 illustrates levels of potentials across line II—II in FIG. 4b, and FIG. 6 illustrates levels of potentials across line 111—111 in FIG. 4b.

Referring to FIGS. 2 and 3, the related art end terminal of a solid state image sensor is provided with a p type well 12 formed in a surface of an n type semiconductor substrate 11, a bulk charge coupled device (BCCD) 13 formed in a surface of the p type well 12, transfer gates 14 for the HCCD 3 formed on the semiconductor substrate with an insulating film in between, insulated from one another, an output gate (OG) 15 formed on the semiconductor substrate 11 with an insulating film in between on one side of the transfer gates 14 insulated therefrom, a reset gate 16 formed on the semiconductor substrate 11 with an insulating film in between on one side of the output gate 15 spaced therefrom, a heavily doped n type floating diffusion region (FD) 17 formed in the BCCD 13 between the output gate 15 and the reset gate 16 and connected to the sensing amplifier 4, and a heavily doped n type reset drain region 18 formed in a surface of the BCCD 13 on one side of the reset gate 16.

Referring to FIGS. 4a and 4b, a related art method for fabricating an end terminal of a solid state image sensor starts from coating a photoresist film 21 on a semiconductor substrate (not shown) in a state a p type well (not shown) is formed in a surface of the semiconductor substrate having an n type floating diffusion region 17 and a reset drain region 18 defined thereon and a BCCD is formed in a surface of the p type well. Subjecting the photoresist film 21 to selective exposure and development leaving a portion of the photoresist film 21 under which a floating diffusion region 17 is to be formed. The photoresist film 21, subjected to selective exposure and development, is used as mask in injecting p type impurity ions into an entire surface. As shown in FIG. 3, this p type impurity ion injection increases a concentration of the impurity only in a portion 'H' of the BCCD 13 at which the floating diffusion region 17 is to be formed. In following steps, transfer gates 14, an output gate 15, a reset gate 16, floating diffusion region 17, and a reset drain region 18 are formed.

Levels of potentials in the related art end terminal of a solid state image sensor having p type impurity ions injected thereto are shown in FIG. 5, and in particular the even potential of output gate 15 can be noted. FIG. 6, shows the HCCD 3 having an even potential between a point 'A' and a point 'B'.

However, the related art method for fabricating a solid state image sensor has a problem in that the charge transfer efficiency of the end terminal of the solid state image sensor is low due to small variations of potential coming from the even potentials both in the output gate and a central portion of the HCCD. The problem is caused by the p type impurity ion injection increasing a concentration of impurities only in a portion H'at which the floating diffusion region is to be formed.

SUMMARY OF THE INVENTION

Accordingly, the invention is directed to a method for fabricating a solid state image sensor that substantially obviates one or more of the problems due to limitations and disadvantages of the related art.

An aspect of the invention is to provide a method for fabricating a solid state image sensor, which can form an end terminal of a solid state image sensor having a greater variation of potentials.

Additional features and advantages of the invention will be set forth in the description which follows, and in part will be apparent from the description, or may be learned by practice of the invention. The aspects and advantages of the invention will be realized and attained by the structure particularly pointed out in the written description and claims hereof as well as the appended drawings.

To achieve these and other advantages and in accordance with the purpose of the invention, as embodied and broadly described, the method for fabricating a solid state image sensor, includes the steps of (1) providing a first conduction type substrate having a second conduction type well and a BCCD formed therein for an end terminal, (2) continuously increasing impurity concentrations in an area of the substrate in which a floating diffusion region is to be formed and a portion of an area of the substrate other regions are to be formed for improving a horizontal charge transfer efficiency, and (3) forming transfer gates, an output gate, and a reset gate on the substrate, and the floating diffusion region and a reset drain region in the BCCD, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
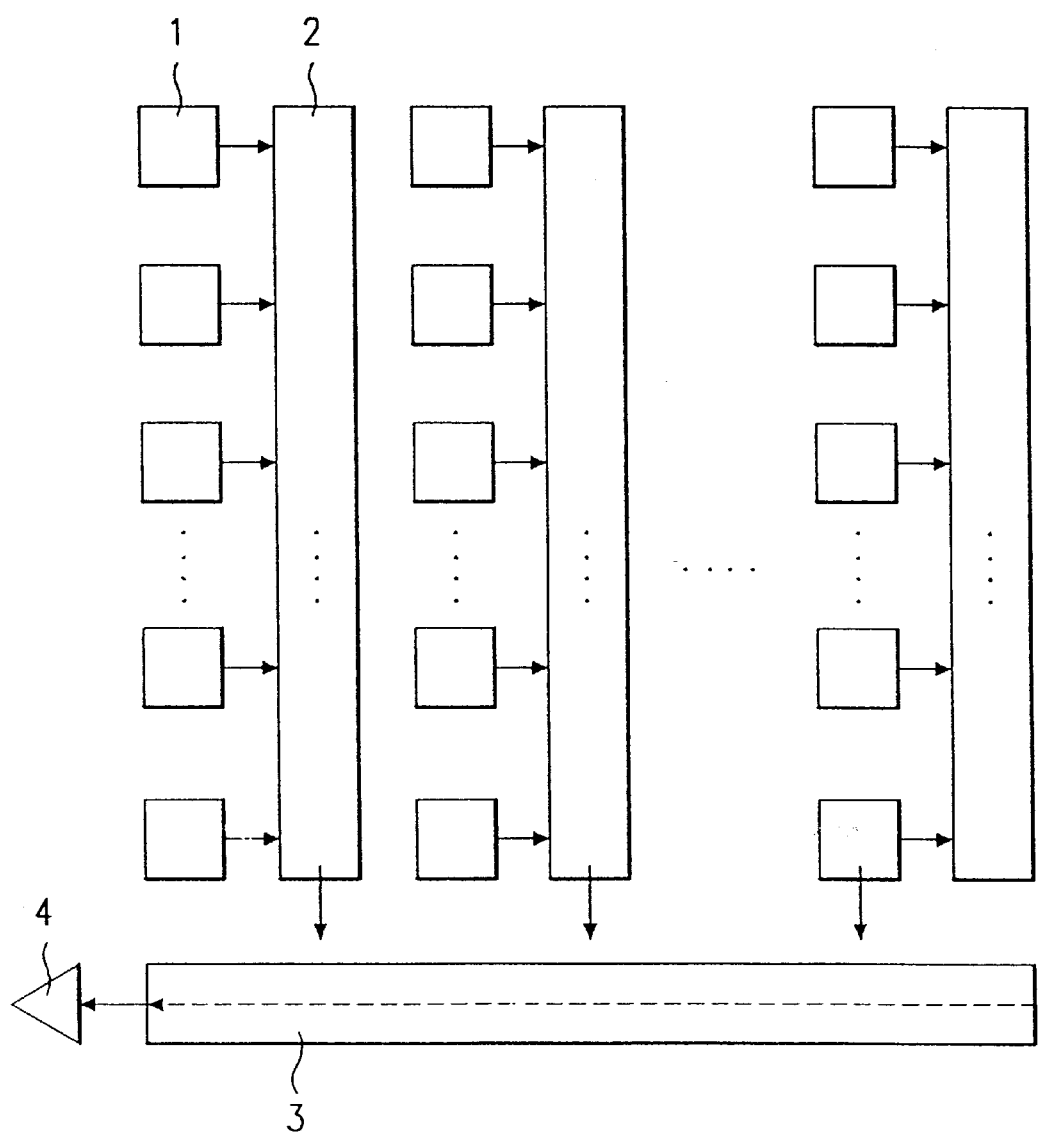
FIG. 1 illustrates a layout of a related art solid state image sensor.
Figure 2:
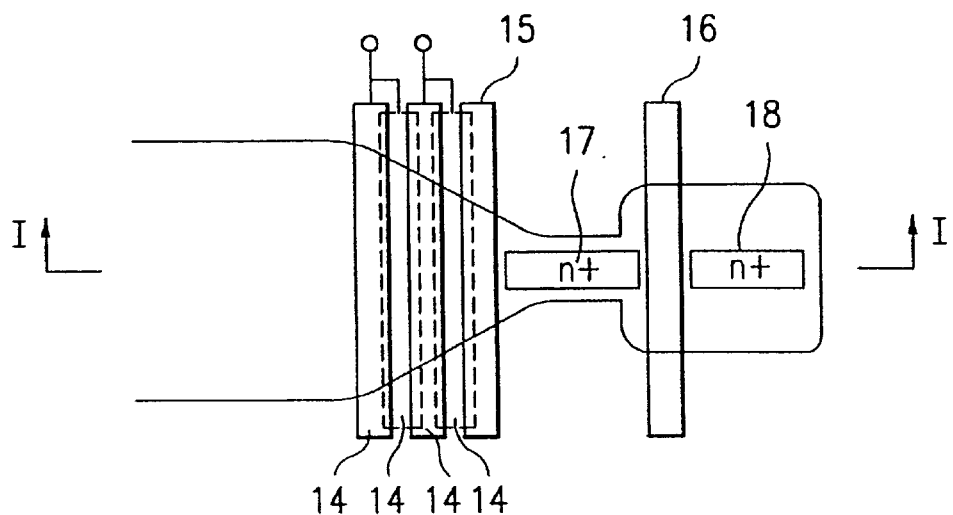
FIG. 2 illustrates a layout of a related art end terminal of a solid state image sensor.
Figure 3:
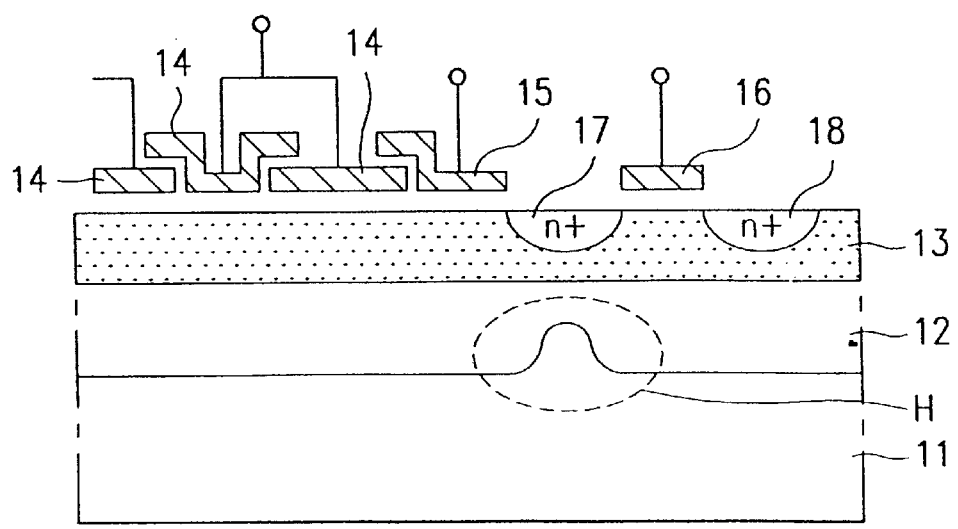
FIG. 3 illustrates a section across line I—I in FIG. 2.
Figure 4A:
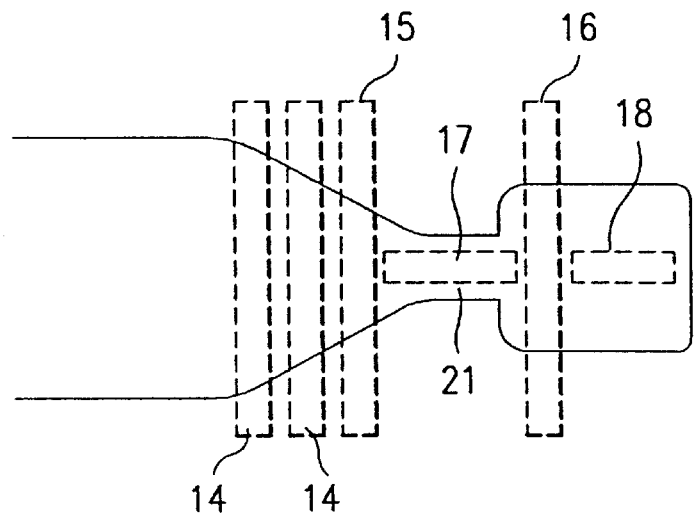
FIGS. 4a and 4b illustrate plan views showing the steps of a related art method for fabricating an end terminal of a solid state image sensor.
Figure 4B:
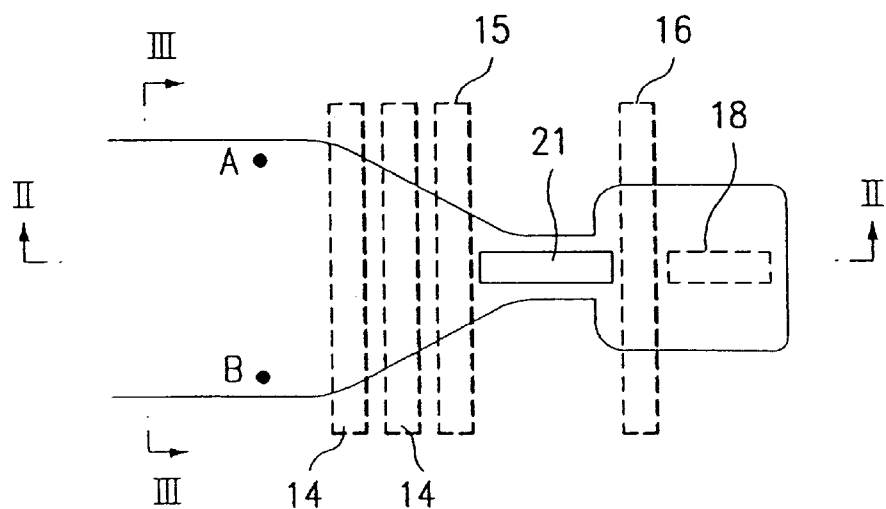
Figure 5:
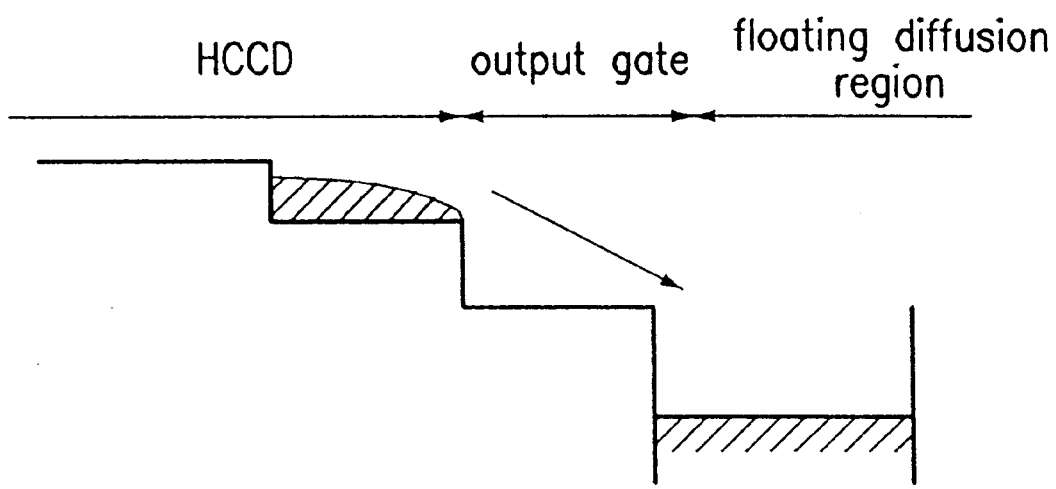
FIG. 5 illustrates levels of potentials across line II—II in FIG. 4b.
Figure 6:
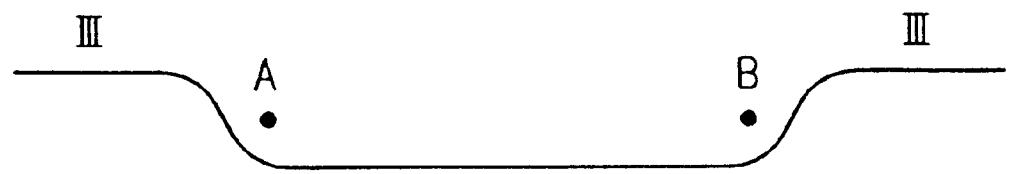
FIG. 6 illustrates levels of potentials across line III—III in FIG. 4b.
Figure 7A:
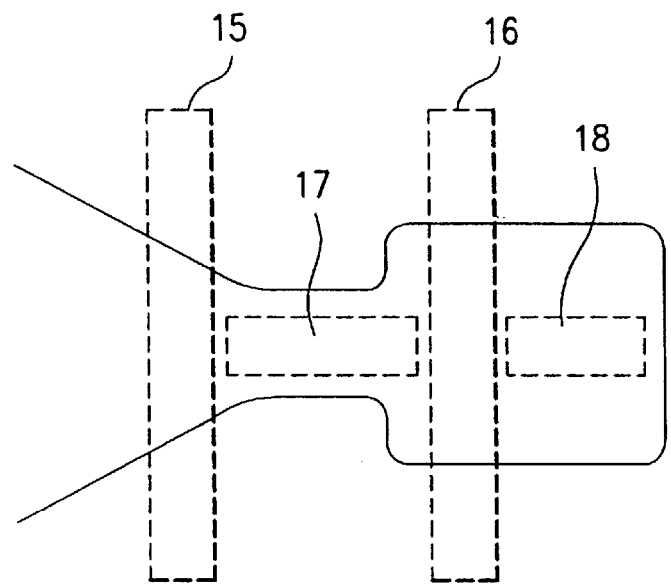
FIGS. 7a and 7b illustrate plan views showing the steps of a method for fabricating an end terminal of a solid state image sensor in accordance with a first preferred embodiment of the present invention.
Figure 7B:
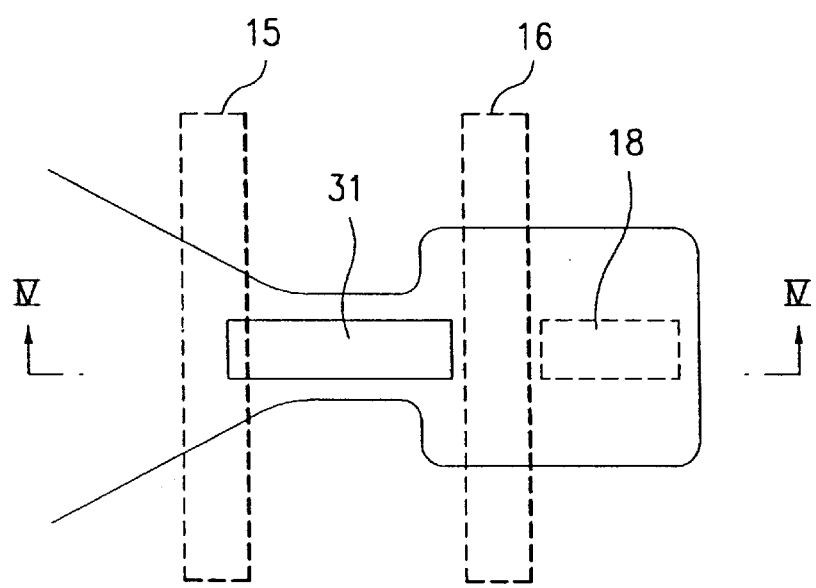
Figure 8:
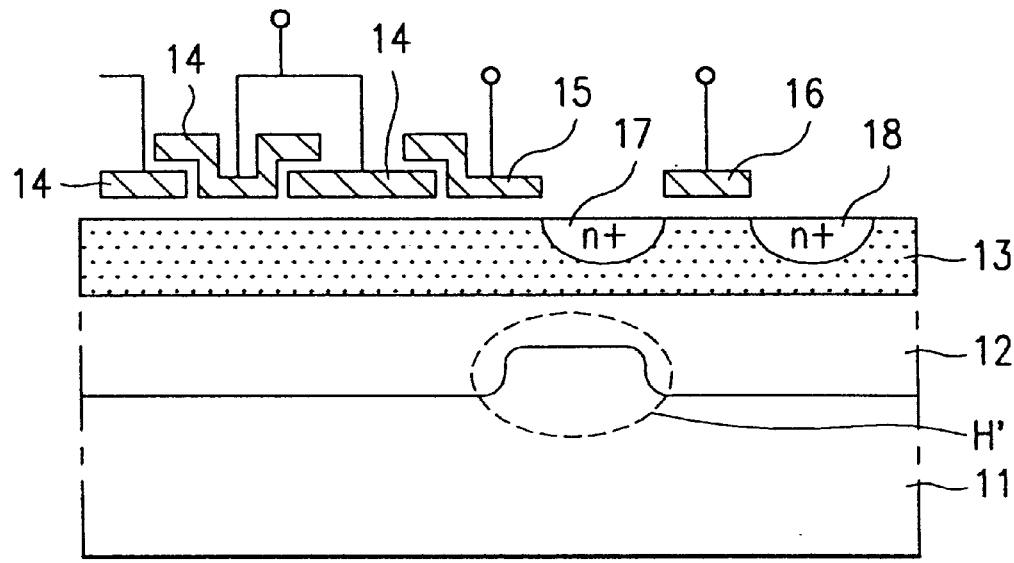
FIG. 8 illustrates a section across line IV—IV in FIG. 7b.
Figure 9:
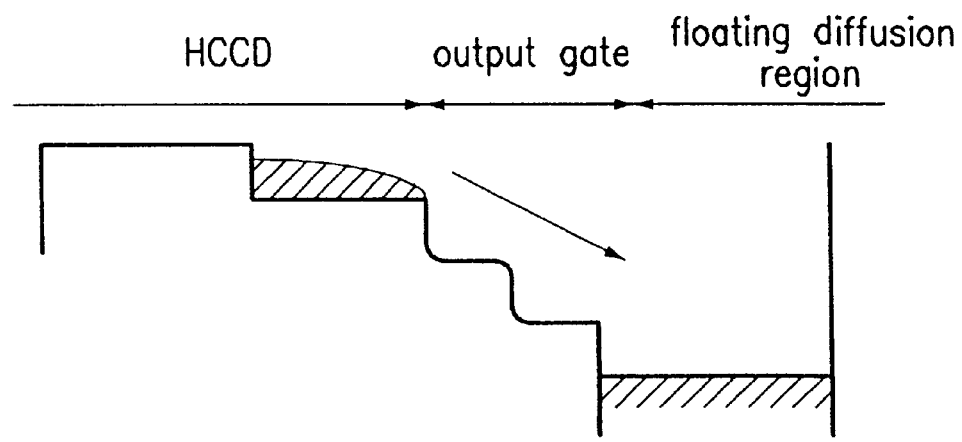
FIG. 9 illustrates levels of potentials across line IV—IV in FIG. 7b.
Figure 10A:
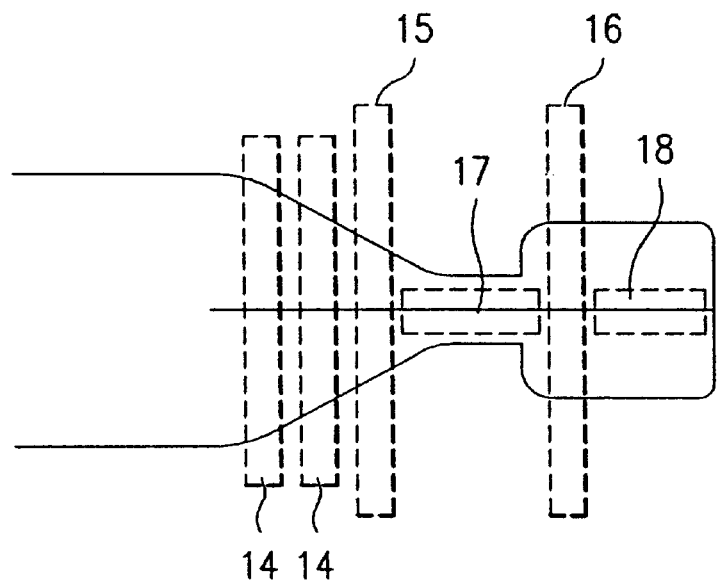
FIGS. 10a and 10b illustrate plan views showing the steps of a method for fabricating an end terminal of a solid state image sensor in accordance with a second preferred embodiment of the present invention.
Figure 10B:
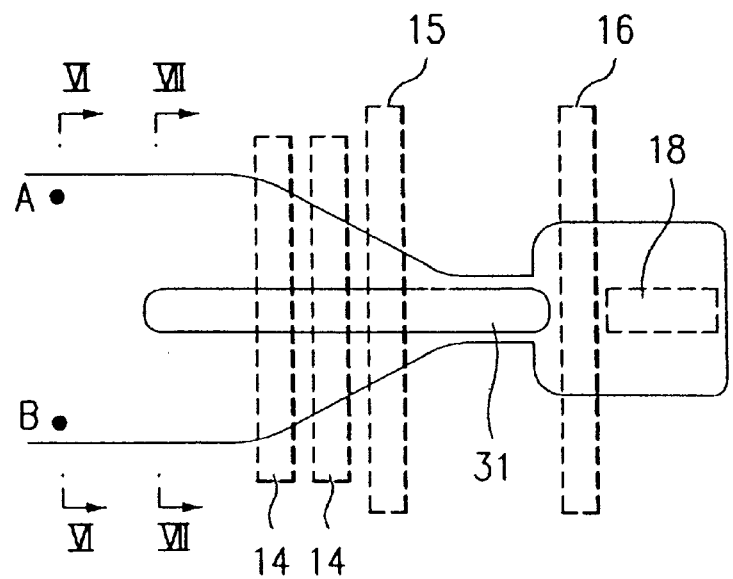
Figure 11:
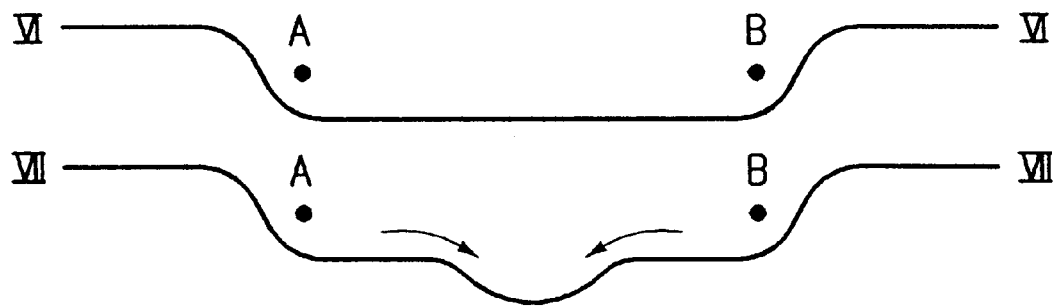
FIG. 11 illustrates levels of potentials across lines VI—VI and VII—VII in FIG. 10b.
Figure 12:
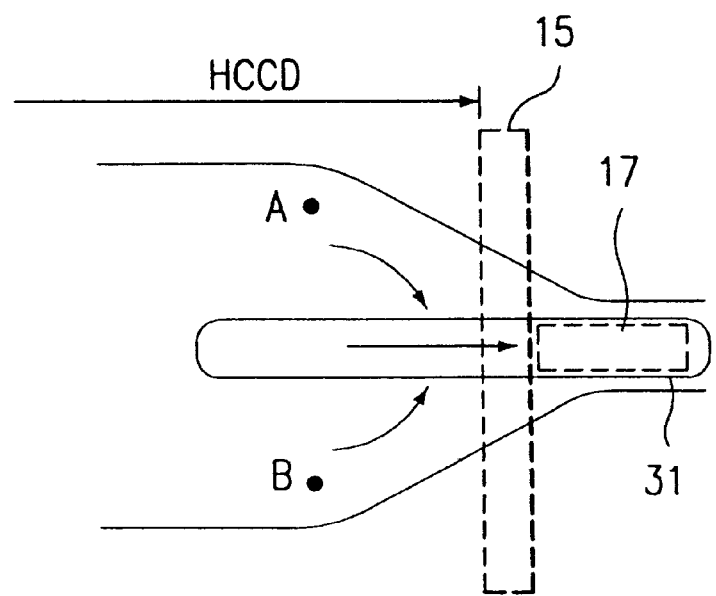
FIG. 12 illustrates movements of charges from an HCCD to a floating diffusion region in the end terminal of a solid state image sensor in accordance with a second preferred embodiment of the present invention.
Figure 13A:
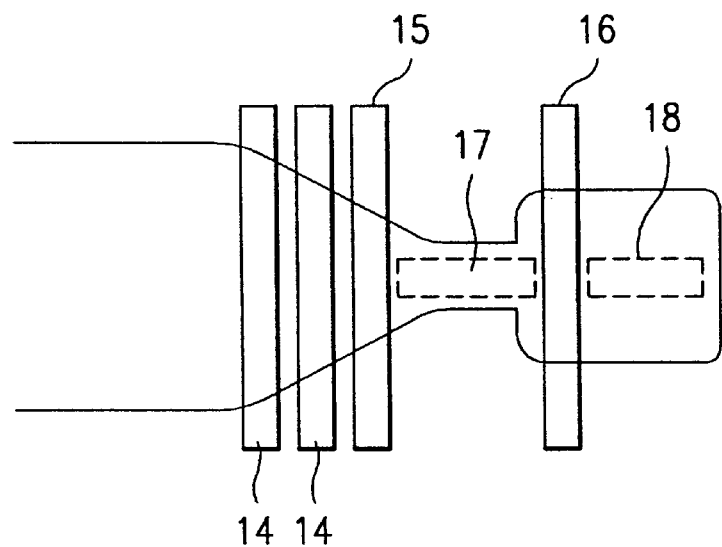
FIGS. 13a and 13b illustrate plan views showing the steps of a method for fabricating an end terminal of a solid state image sensor in accordance with a third preferred embodiment of the present invention.
Figure 13B:
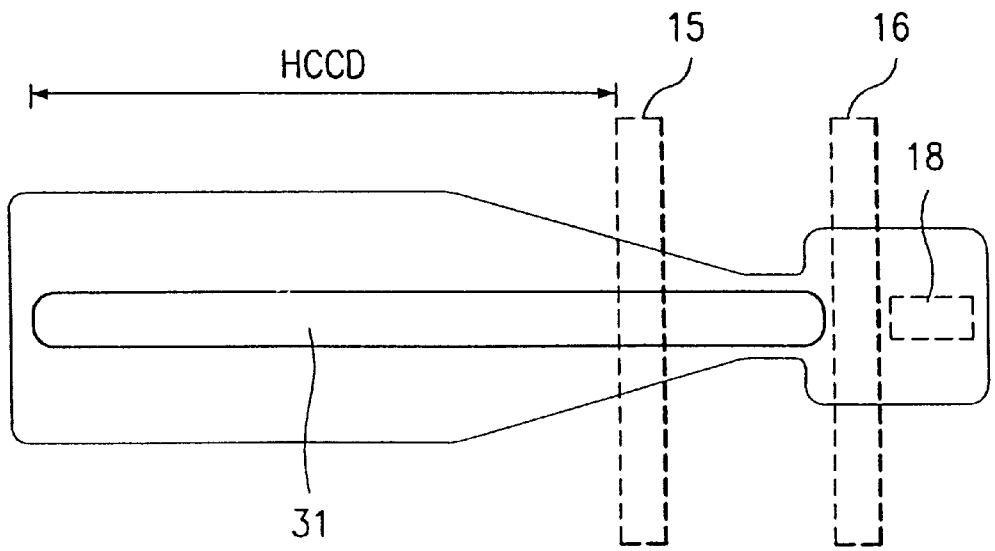
Figure 14:
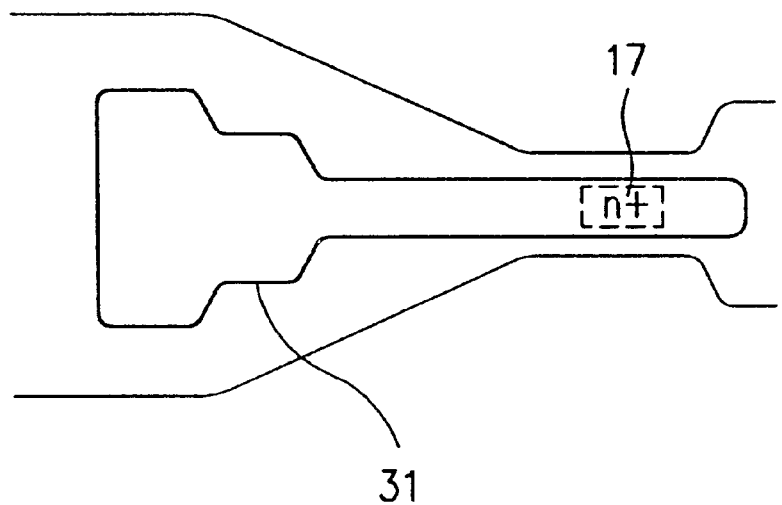
FIG. 14 illustrates a plan view showing a photoresist film becoming gradually wider starting from a floating diffusion region in accordance with a preferred embodiment of the present invention; and, FIG. 15 illustrates a plan view showing a photoresist film becoming gradually narrower starting from a floating diffusion region in accordance with a preferred embodiment of the present invention.
Figure 15:
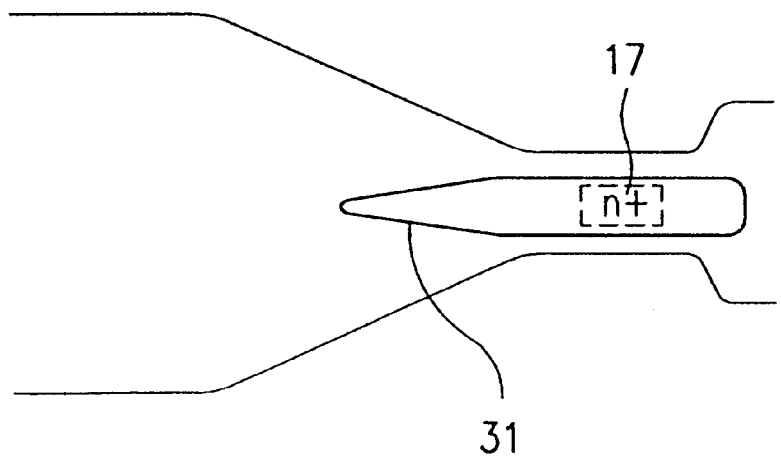

Reference will now be made in detail to the preferred embodiments of the present invention, examples of which are illustrated in the accompanying drawings. FIGS. 7a and 7b illustrate plan views showing the steps of a method for fabricating an end terminal of a solid state image sensor in accordance with a first preferred embodiment of the present invention, FIG. 8 illustrates a section across line IV—IV in FIG. 7b, and FIG. 9 illustrates levels of potentials across line IV—IV in FIG. 7b. FIGS. 10a and 10b illustrate plan views showing the steps of a method for fabricating an end terminal of a solid state image sensor in accordance with a second preferred embodiment of the present invention, FIG. 11 illustrates levels of potentials across lines VI—VI and VII—VII in FIG. 10b, and FIG. 12 illustrates movements of charges from an HCCD to a floating diffusion region in the end terminal of a solid state image sensor in accordance with a second preferred embodiment of the present invention. FIGS. 13a and 13b illustrate plan views showing the steps of a method for fabricating an end terminal of a solid state image sensor in accordance with a third preferred embodiment of the present invention, FIG. 14 illustrates a plan view showing a photoresist film becoming gradually wider starting from a floating diffusion region in accordance with a preferred embodiment of the present invention, and FIG. 15 illustrates a plan view showing a photoresist film becoming gradually narrower starting from a floating diffusion region in accordance with a preferred embodiment of the present invention.

Referring to FIGS. 7a and 7b, the method for fabricating an end terminal of a solid state image sensor in accordance with a first preferred embodiment of the invention starts from coating a photoresist film 31 on a semiconductor substrate (not shown) in a state a p type well (not shown) is formed in a surface of the semiconductor substrate having an n type floating diffusion region 17 and a reset drain region 18 defined thereon and a BCCD (not shown) is formed in a surface of the p type well. Then, the photoresist film 31 is subjected to selective exposure and development leaving the photoresist film 31 in an entire area of the substrate in which the floating diffusion region 17 is to be formed and a portion of an area of the substrate on which an output gate 15 is to be formed. The selective exposure and development form the photoresist film 31 into a line form. The photoresist film 31 subjected to the selective exposure and development is used as a mask in injecting p type impurity ions into an entire surface. As shown in FIG. 8, the p type impurity ion injection increases an impurity concentration H' in the BCCD 13 of the entire area of the substrate in which the floating diffusion region is to be formed and the portion of the area of the substrate on which an output gate 15 is to be formed, continuously. Then, transfer gates 14, an output gate 15, a reset gate 16, a floating diffusion region 17 and a reset drain region 18 are formed, respectively. The end terminal of the solid state image sensor in accordance with the first embodiment of the present invention having p type impurity ions injected thus has potential levels as shown in FIG. 9, and particularly it can be noted that the output gate 15 has a step form of potential levels.

Referring to FIGS. 10a and 10b, the method for fabricating an end terminal of a solid state image sensor in accordance with the second preferred embodiment of the present invention starts from coating a photoresist film 31 on a semiconductor substrate in a state a p type well is formed in a surface of the semiconductor substrate having an n type floating diffusion region 17 and a reset drain region 18 defined thereon and a BCCD is formed in a surface of the p type well. Then, the photoresist film 31 is subjected to selective exposure and development leaving the photoresist film 31 in an entire area of the substrate in which the floating diffusion region 17 is to be formed, a portion of an area of the substrate on which an HCCD 3 is to be formed, and a portion of an area of the substrate on which an output gate 15 is to be formed. The selective exposure and development form the photoresist film 31 into a line form. The photoresist film 31 subjected to the selective exposure and development is used as a mask in injecting p type impurity ions into an entire surface, forming a region in the BCCD 13 with an increased impurity concentration. Then, transfer gates 14, an output gate 15, a reset gate 16, a floating diffusion region 17 and a reset drain region 18 are formed, respectively. As shown in FIG. 11, the HCCD 3 in the end terminal of the solid state image sensor in accordance with the second embodiment of the present invention having p type impurity ions injected thus has a potential level at a center portion of a line between a point A and a point B across line VII—VII higher than other portions. This is because the photoresist film 31 masked the p type impurity ion injection, even though a potential level between point A and point B across line VI—VI are the same as in the related art. As shown in FIG. 12, since the HCCD 3 in the end terminal of the solid state image sensor in accordance with the second embodiment of the present invention has a potential in the center portion thereof higher than the other portion even in a region a width thereof is reduced, charges at points 'A' and 'B' can be transported to the floating diffusion region 17 along the center portion with ease. Therefore, as a width of the HCCD 3 is reduced significantly at an end portion of the HCCD 3 and a width of the floating diffusion region 17 is made narrower the horizontal charge transfer efficiency is improved.

Referring to FIGS. 13a and 13b, the method for fabricating an end terminal of a solid state image sensor in accordance with the third preferred embodiment of the present invention starts from coating a photoresist film 31 on a semiconductor substrate in a state a p type well is formed in a surface of the semiconductor substrate having an n type floating diffusion region 17 and a reset drain region 18 defined thereon and a BCCD is formed in a surface of the p type well. Then, the photoresist film 31 is subjected to selective exposure and development leaving the photoresist film 31 in an entire area of the substrate in which the floating diffusion region 17 is to be formed, a portion of an area of the substrate on which an output gate 15 is to be formed, and an area of the substrate on which all the transfer gates 14 of the HCCD 3 are to be formed. The selective exposure and development form the photoresist film 31 into a line form. The photoresist film 31 subjected to the selective exposure and development is used as a mask in injecting p type impurity ions into an entire surface, forming a region in the BCCD 13 with an increased impurity concentration. Then, transfer gates 14, and output gate 15, a reset gate 16, a floating diffusion region 17 and a reset drain region 18 are formed, respectively.

In the first, second and third embodiments of the present invention, the line form of the photoresist film 31 may be formed to be gradually larger from the floating diffusion region 17 as shown in FIG. 14, or gradually smaller from the floating diffusion region 17 as shown in FIG. 15. And, alike the floating diffusion region 17, no ion injection may be made into the reset drain region 18.

In the first, second and third embodiments of the present invention, the following are first and second alternative methods for continuously increasing an impurity concentration along a portion of the BCCD, an entire area on which the floating diffusion region is to be formed and a portion of an area on which the output gate is to be formed; or a portion of an area on which the HCCD is to be formed; or a portion of an area on which the reset drain region is to be formed.

The first alternative method is selectively subjecting the photoresist film 31 to exposure and development, removing the photoresist film 31 from an entire area of the substrate on which the floating diffusion region 17 is to be formed and a portion of an area of the substrate on which the output gate 15 is to be formed in a case of the first embodiment; or to remove the photoresist film 31 from an entire area of the substrate on which the floating diffusion region 17 is to be formed, a portion of an area of the substrate on which the HCCD 3 is to be formed, and a portion of an area of the substrate on which the output gate 15 is to be formed in a case of the second embodiment; or to remove the photoresist film 31 from an entire area of the substrate on which the floating diffusion region 17 is to be formed, a portion of an area of the substrate on which the output gate 15 is to be formed and an area of the substrate on which all the transfer gates of the HCCD 3 are to be formed in the case of the third embodiment. Then, the photoresist film 31 is used as a mask in injecting n type impurity ions into an entire surface lightly, forming an increased impurity concentration region in the BCCD 13, continuously.

The second alternative method is adjusting the thickness of each of the gate insulating films and the n type impurity concentration of each of the gates. Thus, increasing impurity concentration continuously in a portion of the BCCD 13 in an area in which the entire floating diffusion region is to be formed, or a portion of an area in which the output gate is to be formed thereon, or a portion of an area in which the HCCD is to be formed therein, or a portion of an area of the substrate in which the reset drain region is to be formed therein.

An end terminal of a solid state image sensor in accordance with preferred embodiment of the present invention may be fabricated according to the following process.

A photoresist film 31 is coated on the semiconductor substrate 11, and subjected to selective exposure and development leaving the photoresist film 31 on an entire area of the substrate in which the floating diffusion region 17 is to be formed therein, or a portion of an area of the substrate in which the output gate 15 is to be formed thereon, the HCCD 3 is to be formed therein, or the reset drain region 18 is to be formed therein. The photoresist film 31, having been subjected to selective exposure and development, is used as a mask in injecting p type impurity ions in the semiconductor substrate 11 on which the end terminal is to be formed, and the photoresist film 31 is removed. In this instance, the first and second alternative methods may be employed for forming the increased impurity concentration portion in the BCCD, in which an entire area of the substrate in which the floating diffusion region is to be formed therein, or a portion of an area of the substrate in which the output gate is to be formed thereon, or the HCCD is to be formed therein, or the reset drain region 18 is to be formed therein. Then, p type impurity ions are injected into an entire surface of the semiconductor substrate 11 forming a p type well 12 in the surface of the semiconductor substrate 11, then forming the BCCD 13, the transfer gates 14, the output gate 15, the reset gate 16, the floating diffusion region 17 and the reset drain region 18, respectively.

Because the continuous increase of an impurity concentration in a portion of the BCCD in which an entire area of the floating diffusion region is to be formed therein, or a portion of an area the output gate is to be formed thereon, or the HCCD is to be formed therein, or the reset drain region 18 is to be formed therein improves sensitivity of the end terminal of the solid state image sensor; provides greater variations of potential levels, such as to form a step form of potential levels in the output gate and to form a potential level at a center portion of the HCCD higher than the related art; facilitates easier movements of charges than the related art, the method for fabricating a solid state image sensor can improve a charge transfer efficiency of the end terminal, particularly, a horizontal charge transfer efficiency at a low luminance.

It will be apparent to those skilled in the art that various modifications and variations can be made in the method for fabricating a solid state image sensor of the present invention without departing from the spirit or scope of the invention. Thus, it is intended that the present invention cover the modifications and variations of this invention provided they come within the scope of the appended claims and their equivalents.

What is claimed is:

1. A method for fabricating a solid state image sensor, comprising the steps of:
   (1) providing a first conduction type substrate having a second conduction type well and a BCCD formed therein for an end terminal;
   (2) continuously increasing impurity concentrations in an area of the substrate in which a floating diffusion region is to be formed and in a portion of an area of the substrate in which other regions are to be formed for improving a horizontal charge transfer efficiency; and (3) forming transfer gates, an output gate, and a reset gate on the substrate, and the floating diffusion region and a reset drain region in the BCCD, respectively.

2. A method as claimed in claim 1, further comprising the steps of:

forming a line form of a masking material in parallel to the BCCD on an area of the substrate in which the floating diffusion region is to be formed and on a portion of an area of the substrate in which the other regions are to be formed;

injecting second conduction type impurity ions into an entire surface and removing the masking material, to increase an impurity concentration continuously in a portion of the BCCD masked by the masking material for improving a horizontal charge transfer efficiency; and, forming transfer gates, an output gate, and a reset gate on the substrate, and the floating diffusion region and a reset drain region in the BCCD, respectively.

3. A method as claimed in claim 2, wherein the masking material is formed on areas of the substrate where a portion of the output gate is to be formed and the floating diffusion region is to be formed, respectively.

4. A method as claimed in claim 2, wherein the masking material is formed on areas of the substrate where a portion of the output gate is to be formed, a portion of the HCCD is to be formed, and the floating diffusion region is to be formed, respectively.

5. A method as claimed in claim 2, wherein the masking material is formed on areas of the substrate where a portion of the output gate is to be formed, a portion of the HCCD on which all the transfer gates are to be formed, and the floating diffusion region is to be formed, respectively.

6. A method as claimed in claim 2, wherein the masking material is masking an area of the HCCD on which all the transfer gates are to be formed, and the floating diffusion region is to be formed, respectively.

7. A method as claimed in claim 2, wherein the area the floating diffusion region is to be formed and an area which drops a horizontal charge transfer efficiency are masked by a photoresist film having a width formed gradually larger starting from the floating diffusion region.

8. A method as claimed in claim 2, wherein the area the floating diffusion region is to be formed and an area which drops a horizontal charge transfer efficiency are masked by a photoresist film having a width formed gradually larger starting from the floating diffusion region.

9. A method as claimed in claim 1, further comprising the steps of:

forming a masking material to expose an area of the substrate in which the floating diffusion region is to be formed and only a portion of an area of the substrate in which other regions are to be formed, continuously;

injecting second conduction type impurity ions into an entire surface and removing the masking material, to increase an impurity concentration continuously in a portion of the BCCD masked by the masking material for improving a horizontal charge transfer efficiency, and, forming transfer gates, an output gate, and a reset gate on the substrate, and the floating diffusion region and a reset drain region in the BCCD, respectively.

10. A method as claimed in claim 1, wherein an impurity concentration of a portion of the BCCD is made higher continuously in an entire area of the substrate in which the floating diffusion region is to be formed and a portion of respective areas of the substrate in which regions other than the floating diffusion region are to be formed.

11. A method for fabricating a solid state image sensor, comprising the steps of:

(1) providing a first conduction type substrate having an area of an end terminal inclusive of an HCCD, an output gate, a floating drain region, and a reset drain region defined thereon;

(2) forming a line form of masking material on areas of the substrate where the floating diffusion region is to be formed and a portion of respective areas other than the floating diffusion region is to be formed;

(3) injecting second conduction type impurity ions into an entire surface;

(4) removing the masking material, and forming a second conduction type well in a surface of the substrate; and, (5) forming a BCCD in a surface of the second conduction type well, and forming transfer gates, an output gate, and a reset gate on the substrate and forming a floating diffusion region and a reset drain region in a surface of the BCCD.

12. A method for fabricating a solid state image sensor, comprising the steps of:

(1) providing a first conduction type substrate having a region of an end terminal inclusive of an HCCD, an output gate, a floating drain region, and a reset drain region defined thereon;

(2) forming a masking material on the substrate to expose only areas where the floating diffusion region is to be formed and a portion of respective areas other than the floating diffusion region are to be formed;

(3) injecting first conduction type impurity ions into an entire surface;

(4) removing the masking material, and forming a second conduction type well in a surface of the substrate; and, (5) forming a BCCD in a surface of the second conduction type well, and forming transfer gates, an output gate, and a reset gate on the substrate and forming a floating diffusion region and a reset drain region in a surface of the BCCD.

* * * * *